United States Patent
Ban

(10) Patent No.: US 12,471,439 B2
(45) Date of Patent: Nov. 11, 2025

(54) DISPLAY DEVICE

(71) Applicant: LG DISPLAY CO., LTD., Seoul (KR)

(72) Inventor: Jeongjae Ban, Paju-si (KR)

(73) Assignee: LG Display Co., Ltd (KR)

( * ) Notice: Subject to any disclaimer, the term of this patent is extended or adjusted under 35 U.S.C. 154(b) by 547 days.

(21) Appl. No.: 17/903,129

(22) Filed: Sep. 6, 2022

(65) Prior Publication Data

US 2023/0200115 A1 Jun. 22, 2023

(30) Foreign Application Priority Data

Dec. 21, 2021 (KR) ........................ 10-2021-0184325

(51) Int. Cl.
*H10K 50/844* (2023.01)
*H10K 50/84* (2023.01)

(52) U.S. Cl.
CPC ......... *H10K 50/844* (2023.02); *H10K 50/841* (2023.02)

(58) Field of Classification Search
CPC .............. H10K 50/844; H10K 50/841; H10K 59/8731; H10K 59/124; H10K 59/122
See application file for complete search history.

(56) References Cited

U.S. PATENT DOCUMENTS

| | | | | |
|---|---|---|---|---|
| 11,063,238 B2 * | 7/2021 | Lee | ....................... | H10K 50/844 |
| 2018/0033998 A1 * | 2/2018 | Kim | ....................... | H10K 59/12 |
| 2020/0243401 A1 * | 7/2020 | Wang | ..................... | H10K 71/70 |
| 2021/0134904 A1 | 5/2021 | Zhao et al. | | |
| 2022/0231257 A1 * | 7/2022 | Wang | .................. | H10K 59/879 |
| 2022/0285649 A1 * | 9/2022 | Kim | ..................... | H10K 50/844 |

FOREIGN PATENT DOCUMENTS

| | | | |
|---|---|---|---|
| KR | 20190081005 A | | 7/2019 |
| KR | 20200047839 A | | 5/2020 |
| KR | 2020-0113048 A | | 10/2020 |
| KR | 20210052728 A | | 5/2021 |

OTHER PUBLICATIONS

Office Action in Korean Appln. No. 10-2021-0184325, mailed on Jun. 25, 2025, 9 pages (with English translation).

* cited by examiner

*Primary Examiner* — Shaun M Campbell

(74) *Attorney, Agent, or Firm* — Fish & Richardson P.C.

(57) ABSTRACT

A display device includes a substrate including a display area and a non-display area configured to surround the display area, an inorganic insulating layer on the substrate, a metal layer on the inorganic insulating layer, a dam structure on the metal layer in the non-display area and including a first dam and a second dam positioned to be closer to an outer side of the substrate than be the first dam and a sealing part configured to cover a part of the display area and a part of the non-display area and cover a surface of the dam structure, wherein the metal layer is patterned between the first dam and the second dam.

17 Claims, 12 Drawing Sheets

DAM(DAM1,DAM2)

DISPLAY DEVICE

CROSS-REFERENCE TO RELATED APPLICATION

This application claims the priority of Korean Patent Application No. 10-2021-0184325 filed on Dec. 21, 2021, which is hereby incorporated by reference in its entirety.

BACKGROUND

Field of the Disclosure

The present disclosure relates to a display device, and more particularly, to a display device using a dam.

Description of the Background

An organic light-emitting display device refers to a display device that autonomously emits light. Unlike a liquid crystal display apparatus, the organic light-emitting display device does not require a separate light source and thus may be manufactured as a lightweight, thin display device. In addition, the organic light-emitting display device is advantageous in terms of power consumption because the organic light-emitting display device operates at a low voltage. Further, the organic light-emitting display device is adopted as a next-generation display device because the organic light-emitting display device is excellent in a response speed, a viewing angle, and a contrast ratio.

Further, the organic light-emitting display device has a drawback in that a light-emitting element of the organic light-emitting display device is easily degraded by external factors such as outside moisture or oxygen. To solve the problems, the organic light-emitting display device may have a sealing part configured to inhibit outside moisture or oxygen from penetrating into the light-emitting element. In general, the sealing part includes an inorganic layer and an organic layer, thereby inhibiting oxygen or moisture from penetrating into the light-emitting element.

The organic layer is formed to cover the light-emitting element. The organic layer is generally made of a polymer. The organic layer is formed by applying a liquid organic material onto a substrate and curing the organic material. Because the organic layer has fluidity before the curing process, the organic layer may overflow out of a region in which the sealing part is intended to be formed in some instances. To solve the above-mentioned problem, recently, a dam is formed along an outer periphery of the light-emitting element and blocks an overflow of the organic layer. However, there is a problem in that an organic material constituting the organic layer flows over an outer periphery of the dam even though the dam is formed.

SUMMARY

Accordingly, the present disclosure is to provide a display device, in which an organic sealing layer of a sealing part can be inhibited from flowing over an outer periphery of a dam.

The present disclosure is also to provide a display device, in which an application state of an organic sealing layer of a sealing part can be inspected.

The present disclosure is also to provide a display device, in which a concave-convex pattern may be provided on a side surface of a dam, thereby increasing a contact area between the dam and an organic sealing layer of a sealing part layer.

The present disclosure is not limited to the above-mentioned and other features, which are not mentioned above, can be clearly understood by those skilled in the art from the following descriptions.

According to an aspect of the present disclosure, a display device includes a substrate including a display area and a non-display area configured to surround the display area, an inorganic insulating layer on the substrate, a metal layer on the inorganic insulating layer, a dam structure on the metal layer in the non-display area and including a first dam and a second dam positioned to be closer to an outer side of the substrate than be the first dam and a sealing part configured to cover a part of the display area and a part of the non-display area and cover a surface of the dam structure, wherein the metal layer is patterned between the first dam and the second dam.

According to an aspect of the present disclosure, the metal layer comprises a plurality of holes disposed between the first dam and the second dam.

According to another aspect of the present disclosure, a display device includes a substrate including a display area and a non-display area configured to surround the display area, an inorganic insulating layer on the substrate, a metal layer on the inorganic insulating layer, a dam structure on the metal layer in the non-display area and including a first dam and a second dam positioned to be closer to an outer side of the substrate than be the first dam and a sealing part configured to cover a part of the display area and a part of the non-display area and cover a surface of the dam structure, wherein the metal layer is patterned between the first dam and the second dam.

In a further aspect of the present disclosure, a display device includes a substrate including a display area and a non-display area configured to surround the display area, an inorganic insulating layer on the substrate, a metal layer on the inorganic insulating layer, a dam structure on the metal layer in the non-display area and including a first dam and a second dam positioned to be closer to an outer side of the substrate than be the first dam and a sealing part configured to cover a part of the display area and a part of the non-display area and cover a surface of the dam structure, wherein the metal layer comprises a plurality of holes disposed between the first dam and the second dam, wherein at least one of the first and second dams includes concave-convex patterns disposed on one or more side surface of two opposite surfaces thereof, wherein an additional spacer disposed on the first dam and the second dam and made of the same material as a spacer in the display area.

Other detailed matters of the exemplary aspects are included in the detailed description and the drawings According to the present disclosure, the plurality of metal layers is patterned, which makes it possible to ensure the space capable of accommodating the organic sealing layer of the sealing part.

According to the present disclosure, the hole is formed between the dams, which makes it possible to easily inspect an application state of the organic sealing layer of the sealing part through the hole.

According to the present disclosure, the concave-convex pattern is formed on the side surface of the dam, which makes it possible to inhibit the organic sealing layer from flowing over the outer periphery of the dam.

According to the present disclosure, the additional spacer is disposed on the first dam and the second dam, which further inhibits the organic sealing layer from flowing over an outer periphery of the dam.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
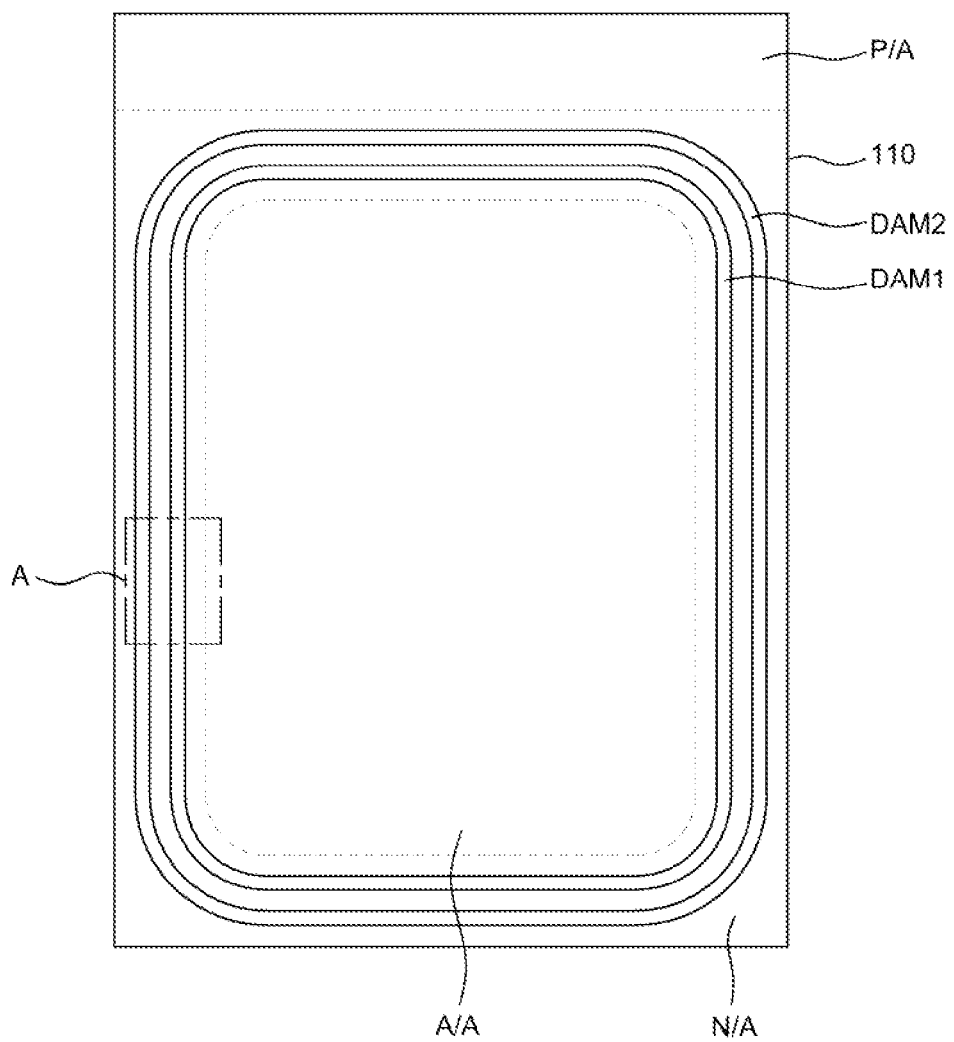
FIG. 1 is a top plan view schematically illustrating a display device according to an aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereinafter, a display device according to exemplary aspects of the present disclosure will be described in detail with reference to accompanying drawings.

FIG. 1 is a top plan view schematically illustrating a display device according to an aspect of the present disclosure. FIG. 1 illustrates only a substrate and a dam structure among various constituent elements of the display device for the convenience of illustration.

Referring to FIG. 1, a display device 100 according to an aspect of the present disclosure includes a display area A/A, a non-display area N/A, and a pad area P/A.

The display area A/A is disposed at a central portion of a substrate 110. The display area A/A is an area in which images are displayed. A plurality of pixels is disposed in the display area A/A. The pixels each include an organic light-emitting element and a driving element. The organic light-emitting element and the driving element may be electrically connected to each other. In this case, the driving element may include a switching transistor and one or more driving transistors. The driving element may be electrically connected to signal lines (a gate line, a data line, and the like) configured to communicate with a gate driver, a data driver, and the like disposed in the non-display area N/A. A more detailed structure of the display area A/A will be described in more detail with reference to FIG. 2.

The non-display area N/A is disposed to surround the display area A/A. A gate driver and a data driver, which are drive circuit parts, are disposed in the non-display area N/A and allow the organic light-emitting element disposed in the display area A/A to emit light. The gate driver and the data driver may each be implemented as a thin film transistor (TFT). The gate driver may be called a gate-in-panel (GIP).

The non-display area N/A may include various additional elements serving to generate various signals or drive the pixels in the display area A/A. The additional elements for driving the pixel may include an inverter circuit, a multiplexer, an electrostatic discharge (ESD) circuit, and the like. In addition, additional elements related to functions other than the function of driving the pixels may be disposed in the non-display area N/A. For example, additional elements, which provide a touch detection function, a user certification function, a multi-level pressure detection function, a tactile feedback function, and the like, may be disposed in the non-display area N/A. In the aspect of the present disclosure, the configuration has been described in which the additional elements for driving the pixels and the additional elements related to the functions other than the function of driving the pixels are disposed in the non-display area N/A. However, the present disclosure is not limited thereto.

The pad area P/A is an area in which a pad part of the display device 100 is disposed. The pad part may include a plurality of pads. A ductility printed circuit board, a COF (chip on film), and the like may be bonded to the plurality of pads.

A dam structure DAM is disposed in the non-display area N/A. The dam structure DAM is disposed to control spread of an organic sealing layer constituting a sealing part disposed in the display area A/A and the non-display area N/A of the substrate 110. The dam structure DAM may include a first dam DAM1 and a second dam DAM2. The first dam DAM1 may be disposed adjacent to the display area A/A and surround the display area A/A. The second dam DAM2 may surround an outer periphery of the first dam. The sealing part and the dam structure DAM will be described in more detail with reference to FIGS. 2 to 3B.

Figure 2:
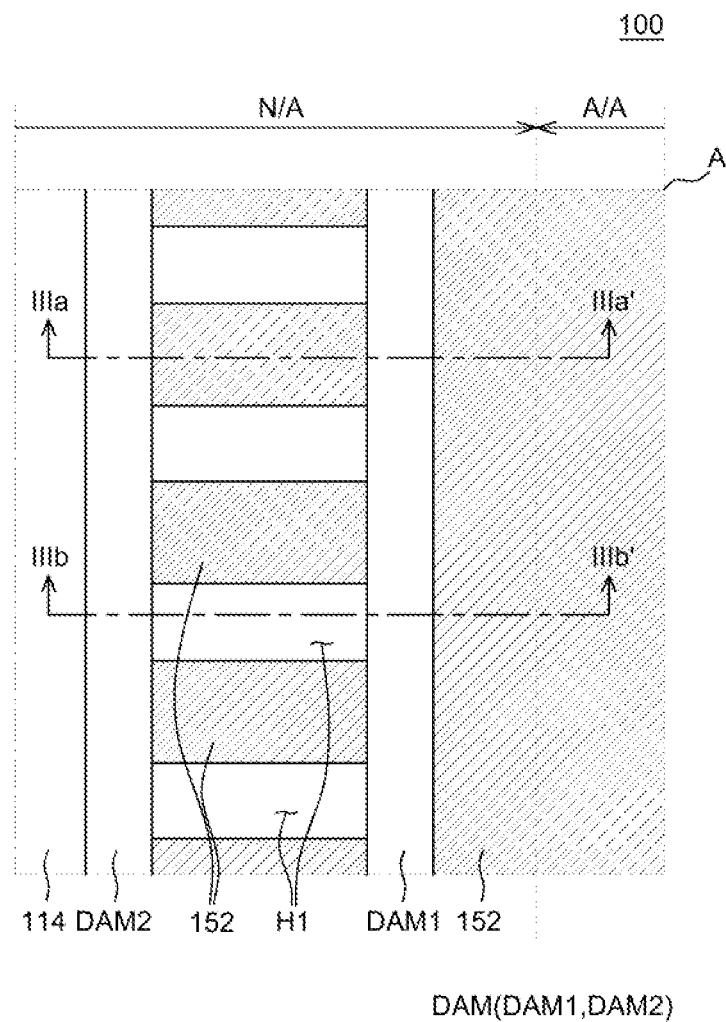
FIG. 2 is an enlarged top plan view of region "A" in FIG. 1.
Figure 3A:
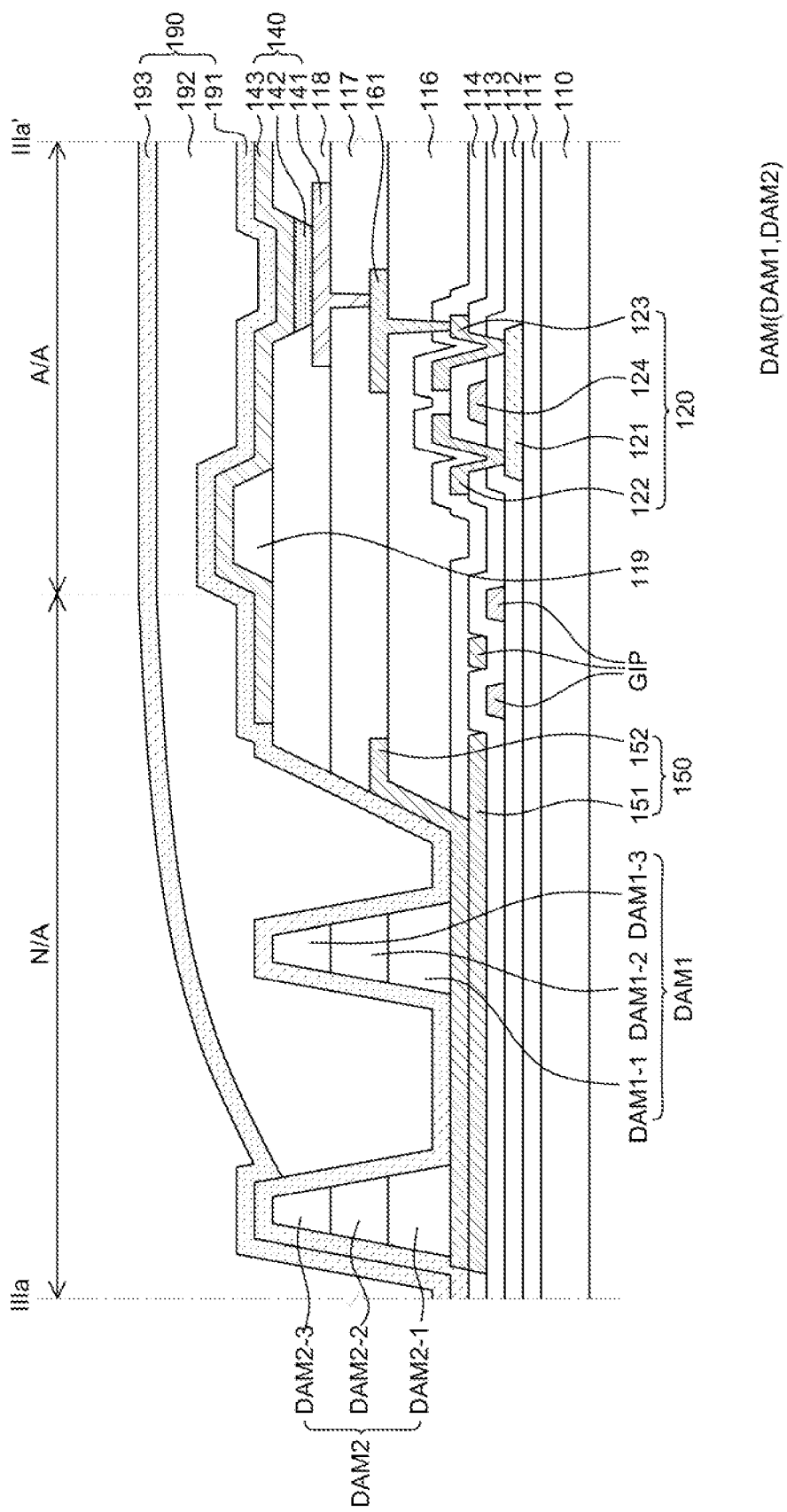
FIG. 3A is a cross-sectional view taken along line IIIa-IIIa' in FIG. 2 and schematically illustrating the display device.
Figure 3B:
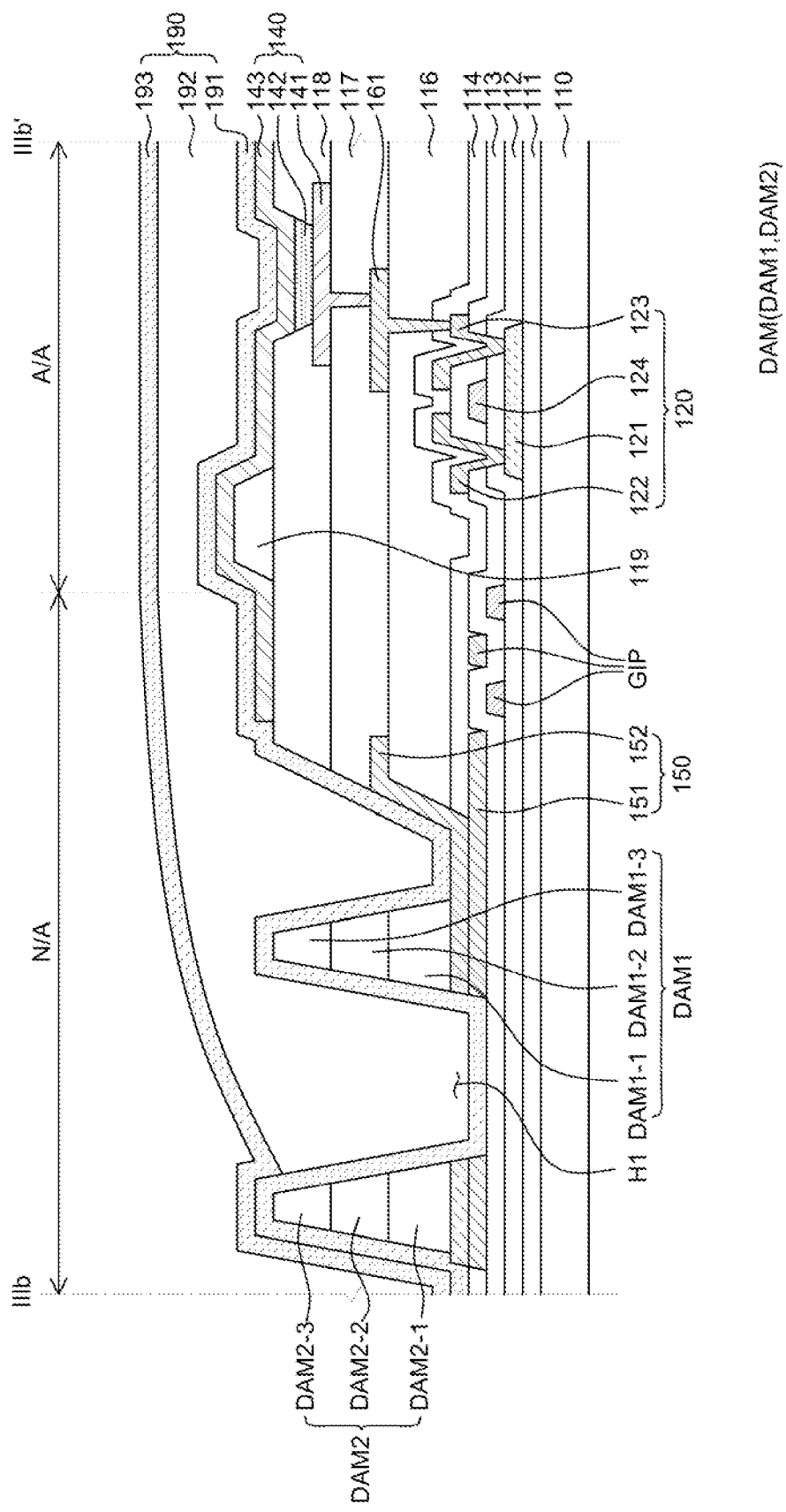
FIG. 3B is a cross-sectional view taken along line IIIb-IIIb' in FIG. 2 and schematically illustrating the display device.

FIG. 2 is an enlarged top plan view of region A in FIG. 1. FIG. 3A is a cross-sectional view taken along line IIIa-IIIa' in FIG. 2 and schematically illustrating the display device. FIG. 3B is a cross-sectional view taken along line IIIb-IIIb' in FIG. 2 and schematically illustrating the display device. For the convenience of illustration, FIG. 2 illustrates only the dam structure, a passivation layer, and a second metal layer of an auxiliary metal layer among various constituent elements of the display device 100.

Referring to FIGS. 2, 3A, and 3B, the display device 100 according to the aspect of the present disclosure may include a thin film transistor 120, a light-emitting element 140, the substrate 110, a buffer layer 111, a gate insulating layer 112, an interlayer insulating layer 113, a passivation layer 114, a first planarization layer 116, a second planarization layer 117, a connection electrode 161, a bank 118, a spacer 119, a gate driving part GIP, an auxiliary metal layer 150, the dam structure DAM, and a sealing part 190.

The substrate 110 may support various constituent elements of the display device 100.

The substrate 110 may be made of a plastic material having flexibility. When the substrate 110 is made of a plastic material, the substrate 110 may be made of polyimide (PI), for example, but the present disclosure is not limited thereto.

Referring to FIG. 3A, the buffer layer 111 having a single-layered or multilayered structure may be disposed on the substrate 110. The buffer layer 111 disposed on the substrate 110 may be a single layer made of silicon nitride (SiNx) or silicon oxide (SiOx) or a multilayer including the above-mentioned layers.

The buffer layer 111 may serve to increase bonding forces between the substrate 110 and layers formed on the buffer layer 111 and block a leak of an alkaline material from the substrate 110. However, the buffer layer 111 is not the essential constituent element. The buffer layer 111 may be eliminated depending on the type and material of the substrate 110, the structure and type of the thin film transistor, and the like.

The thin film transistor 120 may be disposed on the buffer layer 111 and serve to drive the light-emitting element 140 in the display area A/A of the substrate 110. The thin film transistor 120 may include an active layer 121, a gate electrode 124, a source electrode 122, and a drain electrode 123.

The active layer 121 of the thin film transistor 120 may be disposed on the buffer layer 111 in the display area A/A of the substrate 110. The active layer 121 may include low-temperature poly-silicon (LTPS). However, the present disclosure is not limited thereto. The active layer 121 may include an oxide semiconductor such as indium-gallium-zinc-oxide (IGZO), indium-zinc-oxide (IZO), indium-gallium-tin-oxide (IGTO), and indium-gallium-oxide (IGO).

The gate insulating layer 112 may be disposed on the buffer layer 111 and cover an upper surface of the active layer 121 of the thin film transistor 120. The gate insulating layer 112 may be a single layer made of silicon nitride (SiNx) or silicon oxide (SiOx) or a multilayer including the above-mentioned layers. The gate insulating layer 112 may have a contact hole through which the source electrode 122 and the drain electrode 123 of the thin film transistor 120 are connected to the active layer 121 of the thin film transistor 120.

Referring to FIG. 3A, the gate insulating layer 112 may be disposed on the active layer 121 in the display area A/A. Further, the gate insulating layer 112 may be disposed on the buffer layer 111 in the non-display area N/A. As illustrated in FIG. 3A, the gate insulating layer 112 may be formed over a front surface of the substrate 110. However, the present disclosure is not limited thereto. For example, the gate insulating layer 112 may be patterned to have the same width as the gate electrode 122.

A gate line may be disposed on the gate insulating layer 112 in the display area A/A of the substrate 110 and connected to the gate electrode 124 of the thin film transistor 120. The gate electrode 124 and the gate line may each be configured as a single layer or multilayer made of any one of molybdenum (Mo), copper (Cu), titanium (Ti), aluminum (Al), chromium (Cr), gold (Au), nickel (Ni), and neodymium (Nd) or an alloy thereof, but the present disclosure is not limited thereto. The gate electrode 124 may be formed on the gate insulating layer 112 and overlap a channel area of the active layer 121 of the thin film transistor 120.

The gate driving part GIP may be disposed on the gate insulating layer 112 in the non-display area N/A. The gate driving part GIP may include a plurality of thin film transistors, capacitors, and wires.

Referring to FIG. 3A, the interlayer insulating layer 113 may be disposed on the gate insulating layer 112 and cover the gate electrode 124 in the display area A/A. The interlayer insulating layer 113 may be a single layer made of an inorganic insulating layer, such as silicon nitride (SiNx) or silicon oxide (SiOx), or a multilayer including the above-mentioned layers. The interlayer insulating layer 113 may have a contact hole through which a source area and a drain area of the active layer 121 of the thin film transistor 120 are exposed. Further, as illustrated in FIG. 3A, the interlayer insulating layer 113 may be formed over the front surface of the substrate 110, but the present disclosure is not limited thereto.

The source electrode 122 and the drain electrode 123 of the thin film transistor 120 may be disposed on the interlayer insulating layer 113 in the display area A/A of the substrate 110. Further, the source electrode 122 and the drain electrode 123 of the thin film transistor 120 may be connected to the active layer 121 of the thin film transistor 120 through the contact holes formed in the gate insulating layer 112 and the interlayer insulating layer 113. Therefore, the source electrode 122 of the thin film transistor 120 may be connected to the source area of the active layer 121 through the contact holes formed in the gate insulating layer 112 and the interlayer insulating layer 113. Further, the drain electrode 123 of the thin film transistor 120 may be connected to the drain area of the active layer 121 through the contact holes formed in the gate insulating layer 112 and the interlayer insulating layer 113. The source electrode 122 and the drain electrode 123 may each be configured as a single layer or multilayer made of any one of molybdenum (Mo), copper (Cu), titanium (Ti), aluminum (Al), chromium (Cr), gold (Au), nickel (Ni), and neodymium (Nd) or an alloy thereof.

For the convenience of description, FIG. 3A illustrates only the driving thin film transistor among various thin film transistors that may be included in the display device 100. However, the display device 100 may also include other thin film transistors such as a switching thin film transistor. In addition, in the present disclosure, the thin film transistor 120 has been described as having a coplanar structure. However, the thin film transistor may be implemented to have other structures such as a staggered structure.

Referring to FIG. 3A, a first metal layer 151 of the auxiliary metal layer 150 may be disposed on the interlayer insulating layer 113 in the non-display area N/A. The auxiliary metal layer 150 may be disposed in the non-display area N/A and formed on the same layer and made of the same material as the metal layers in the display area A/A. The auxiliary metal layer 150 may include a first metal layer 151 and a second metal layer 152. The first metal layer 151 may be disposed on the same layer and made of the same material as the source electrode 122 and the drain electrode 123 of the thin film transistor 120. However, the present disclosure is not limited thereto. The first metal layer 151 may be made of the same material as the gate electrode 122 or the connection electrode 161. In addition, the first metal layer 151 may serve as a wire for supplying low-potential voltage (VSS).

Referring to FIG. 3A, the passivation layer 114 may be disposed on the thin film transistor 120, the first metal layer 151, and the gate driving part GIP in the display area A/A and the non-display area N/A. The passivation layer 114 may be disposed to cover the thin film transistor 120, the first metal layer 151, and the gate driving part GIP. The passivation layer 114 may be a single layer made of silicon nitride (SiNx) or silicon oxide (SiOx) or a multilayer including the above-mentioned layers. In the display area A/A, the passivation layer 114 may have a contact hole through which the drain electrode 123 of the thin film transistor 120 is exposed.

The first planarization layer 116 may be disposed on the passivation layer 114 in the display area A/A and the non-display area N/A. In the display area A/A, the first planarization layer 116 may have a contact hole through which the drain electrode 123 is exposed. The first planarization layer 116 may be a layer serving to protect the thin film transistor 120 and the gate driving part GIP. The first planarization layer 116 serves to planarize an upper portion of the substrate 110 by reducing a level difference on the substrate 110. For example, the first planarization layer 116 may be made of, but not limited to, an organic material such as acrylic resin, epoxy resin, phenolic resin, polyamide resin, and polyimide resin.

The connection electrode 161 may be disposed on the first planarization layer 116 in the display area A/A of the substrate 110. Further, the connection electrode 161 may be connected to the drain electrode 123 of the thin film transistor 120 through the contact holes of the first planarization layer 116 and the passivation layer 114 through which the drain electrode 123 is exposed. The connection electrode 161 may serve to electrically connect the thin film transistor 120 and the light-emitting element 140. For example, the connection electrode 161 may serve to electrically connect the drain electrode 123 of the thin film transistor 120 and a first electrode 141 of the light-emitting element 140. The connection electrode 161 may be configured as a single layer or multilayer made of any one of molybdenum (Mo), copper (Cu), titanium (Ti), aluminum (Al), chromium (Cr), gold (Au), nickel (Ni), and neodymium (Nd) or an alloy thereof, but the present disclosure is not limited thereto. The connection electrode 161 may be made of the same material as the source electrode 122 and the drain electrode 123 of the thin film transistor 120.

Further, the second metal layer 152 of the auxiliary metal layer 150 may be disposed on the first planarization layer 116 in the non-display area N/A of the substrate 110. Further, the second metal layer 152 may be provided in a region in which the first planarization layer 116 and the passivation layer 114 are opened. The second metal layer 152 may be disposed on the first metal layer 151. The second metal layer 152 may be disposed between the first metal layer 151 and the dam structure DAM. One end of the second metal layer 152 may be disposed on the first planarization layer 116, and the other end of the second metal layer 152 may be disposed on the passivation layer 114. In addition, since the first metal layer 151 may serve as a wire for supplying low-potential voltage (VSS), the second metal layer 152 may serve to supply low-potential voltage to a second electrode 143 of the light-emitting element 140. The second metal layer 152 may be formed on the same layer and made of the same material as the connection electrode 161. However, the second metal layer 152 may be formed on the same layer and made of the same material as the source electrode 122 and the drain electrode 123 of the thin film transistor 120, but the present disclosure is not limited thereto. Specifically, the second metal layer 152 may be configured as a single layer or multilayer made of any one of molybdenum (Mo), copper (Cu), titanium (Ti), aluminum (Al), chromium (Cr), gold (Au), nickel (Ni), and neodymium (Nd) or an alloy thereof, but the present disclosure is not limited thereto.

Referring to FIG. 3A, the first planarization layer 116 may be disposed in the display area A/A and the non-display area N/A. However, the first planarization layer 116 may not be disposed in a region of the non-display area N/A where at least one of the auxiliary metal layer 150 and the dam structure DAM is positioned. For example, the first planarization layer 116 may not be disposed in a region in which the dam structure DAM is disposed and a region of the first metal layer 151 exposed by the passivation layer 114.

The second planarization layer 117 may be disposed on the connection electrode 161 and the first planarization layer 116 in the display area A/A of the substrate 110. For example, the second planarization layer 117 may be disposed on the first planarization layer 116 and cover the connection electrode 161. Further, as illustrated in FIG. 3A, the second planarization layer 117 may have a contact hole through which the connection electrode 161 is exposed. The second planarization layer 117 may be an organic layer that additionally protects a lower structure while reducing a level difference of the lower structure caused by the connection electrode 161 on the first planarization layer 116. For example, the second planarization layer 117 may be made of, but not limited to, an organic material such as acrylic resin, epoxy resin, phenolic resin, polyamide resin, and polyimide resin. The second planarization layer 117 may be made of the same material as the first planarization layer 116.

Further, the second planarization layer 117 may be disposed on the first planarization layer 116 in the non-display area N/A of the substrate 110. Further, the second planarization layer 117 may be disposed to cover one side of the second metal layer 152. In addition, the second planarization layer 117 may not be disposed in a region in which the first metal layer 151 is positioned.

Since the two planarization layers 116 and 117 are disposed between the thin film transistor 120 and the light-emitting element 140 in the display area A/A, it may be difficult to electrically connect the first electrode 141 and the thin film transistor 120 through a process of forming a single contact hole. Therefore, in the display device 100 according to the aspect of the present disclosure, the connection electrode 161 electrically connected to the thin film transistor 120 may be disposed on the first planarization layer 116 in the display area A/A, and the connection electrode 161 may be connected to the first electrode 141, which is disposed on the second planarization layer 117, through the contact hole of the second planarization layer 117.

The light-emitting element 140 may be disposed on the second planarization layer 117 in the display area A/A of the substrate 110. The light-emitting element 140 may include the first electrode 141, a light-emitting structure 142, and the second electrode 143.

Referring to FIG. 3A, the first electrode 141 of the light-emitting element 140 may be disposed on the second planarization layer 117 in the display area A/A. The first electrode 141 may be electrically connected to the connection electrode 161 through the contact hole formed in the second planarization layer 117. Therefore, the first electrode 141 may be electrically connected to the thin film transistor 120 by being connected to the connection electrode 161 through the contact hole formed in the second planarization layer 117.

The first electrode 141 may have a multilayered structure including a transparent conductive film and an opaque conductive film having high reflection efficiency. The transparent conductive film may be made of a material such as indium-tin-oxide (ITO) and indium-zinc-oxide (IZO) having a comparatively large work function value. Further, the opaque conductive film may have a single-layered or multilayered structure made of aluminum (Al), silver (Ag), copper (Cu), lead (Pb), molybdenum (Mo), titanium (Ti), or an alloy thereof. For example, the first electrode 141 may have a structure in which the transparent conductive film, the opaque conductive film, and the transparent conductive film are sequentially stacked. However, the present disclosure is not limited thereto. The first electrode 141 may have a structure in which the transparent conductive film and the opaque conductive film are sequentially stacked.

Since the display device 100 according to the aspect of the present disclosure is a top emission display device, the first electrode 141 may be an anode electrode. When the display device 100 is a bottom emission display device, the first electrode 141 disposed on the second planarization layer 117 may be a cathode electrode.

The bank 118 may be disposed on the first electrode 141 and the second planarization layer 117. In the display area A/A, the bank 118 may have an opening portion through which the first electrode 141 is exposed. The bank 118 may be disposed to cover two opposite ends of the first electrode 141. The spacer 119 may be further disposed on the bank 118.

The bank 118 and the spacer 119 may be made of the same material. Further, the bank 118 and the spacer 119 may each be made of an organic material. For example, the bank 118 and the spacer 119 may each be made of, but not limited to, polyimide-based resin, acryl-based resin, or benzocyclobutene (BCB)-based resin.

Further, the light-emitting structure 142 including a light-emitting layer may further be disposed on the first electrode 141. FIG. 3A illustrates that the light-emitting structure 142 is patterned for each pixel, but the present disclosure is not limited thereto. The light-emitting structure 142 may be a common layer formed in common for the plurality of pixels. The light-emitting structure 142 may be formed by stacking a positive hole layer, a light-emitting layer, and an electron layer in this order or in the reverse order on the first electrode 141. In addition, the light-emitting structure 142 may have first and second light-emitting structures facing each other with a charge generation layer interposed therebetween. In this case, the light-emitting layer of any one of the first and second light-emitting structures emits blue light, and the light-emitting layer of the other of the first and second light-emitting structures emits yellow-green light. Therefore, white light may be emitted by the first and second light-emitting structures. The white light emitted by the light-emitting structure 142 may enter a color filter positioned on an upper portion of the light-emitting structure 142, thereby implementing a color image. In addition, the light-emitting structures 142 may each emit color light corresponding to each subpixel, thereby implementing a color image without a separate color filter. For example, the light-emitting structure 142 for a red (R) subpixel may emit red light, the light-emitting structure 142 for a green (G) subpixel may emit green light, and the light-emitting structure 142 for a blue (B) subpixel may emit blue light.

Referring to FIG. 3A, the second electrode 143 may further be disposed on the light-emitting structure 142 in the display area A/A. The second electrode 143 may be disposed on the light-emitting structure 142 and face the first electrode 141 with the light-emitting structure 142 interposed therebetween. In the display device 100 according to the aspect of the present disclosure, the second electrode 143 may be a cathode electrode.

Referring to FIG. 3A, the sealing part 190 may be formed to cover the light-emitting element 140, thereby inhibiting moisture from penetrating into the light-emitting element 140. For example, the sealing part 190 for inhibiting the penetration of moisture may be disposed on the second electrode 143. Further, the sealing part 190 may also be disposed on the gate driving part GIP.

The sealing part 190 may include at least one inorganic sealing layer and at least one organic sealing layer. For example, the sealing part 190 may include a first inorganic sealing layer 191, an organic sealing layer 192, and a second inorganic sealing layer 193. The first inorganic sealing layer 191 of the sealing part 190 may be disposed on the second electrode 143. Further, the organic sealing layer 192 may be disposed on the first inorganic sealing layer 191. In addition, the second inorganic sealing layer 193 may be disposed on the organic sealing layer 192. The first inorganic sealing layer 191 and the second inorganic sealing layer 193 of the sealing part 190 may each be made of an inorganic material such as silicon nitride (SiNx) or silicon oxide (SiOx). The organic sealing layer 192 of the sealing part 190 may be made of an organic material such as acrylic resin, epoxy resin, phenolic resin, polyamide resin, and polyimide resin.

Referring to FIG. 3A, the dam structure DAM may be disposed on the passivation layer 114 in the non-display area N/A. The dam structure DAM inhibits the overflow of the organic sealing layer 192 of the sealing part 190. The dam structure DAM may include the second dam DAM2, and the first dam DAM1 disposed between the second dam DAM2 and the display area A/A. For example, the first dam DAM1 and the second dam DAM2 may be disposed on the passivation layer 114 and the auxiliary metal layer 150. The first dam DAM1 and the second dam DAM2 may overlap the first metal layer 151 and the second metal layer 152. For example, the first dam DAM1 and the second dam DAM2 may be disposed so that a lower surface of the first dam DAM1 and a lower surface of the second dam DAM2 overlap an upper surface of the second metal layer 152. The first dam DAM1 may be disposed between the second dam DAM2 and the gate driving part GIP. The first dam DAM1 may be disposed to surround an outer periphery of the display area A/A and primarily block the overflow of the organic sealing layer 192 of the sealing part 190. In addition, the dam structure DAM may be disposed between the display area A/A and the pad area P/A and block the overflow of the organic sealing layer 192 to inhibit the organic sealing layer 192 of the sealing part 190 from entering the pad area P/A. Further, the first dam DAM1 may be disposed to be spaced apart from one side of the first planarization layer 116 so that the auxiliary metal layer 150 is exposed.

Referring to FIG. 3A, the first dam DAM1 and the second dam DAM2 may each be configured as a multilayer. For example, the first dam DAM1 may include a first layer DAM1-1 of the first dam, a second layer DAM1-2 of the first dam, and a third layer DAM1-3 of the first dam. Further, the second dam DAM2 may include a first layer DAM2-1 of the second dam, a second layer DAM2-2 of the second dam, and a third layer DAM2-3 of the second dam. The first layer DAM1-1 of the first dam and the first layer DAM2-1 of the second dam may be disposed on the passivation layer 114 and the second metal layer 152. The first layer DAM1-1 of the first dam and the first layer DAM2-1 of the second dam may be formed by the same process and made of the same material as the first planarization layer 116.

The second layer DAM1-2 of the first dam may be disposed on the first layer DAM1-1 of the first dam. In addition, the second layer DAM2-2 of the second dam may be disposed on the first layer DAM2-1 of the second dam. The second layer DAM1-2 of the first dam and the second layer DAM2-2 of the second dam may be formed by the same process and made of the same material as the second planarization layer 117.

The third dam layer DAM1-3 of the first dam may be disposed on the second layer DAM1-2 of the first dam. Further, the third layer DAM2-3 of the second dam may be disposed on the second layer DAM2-2 of the second dam. In addition, the third layer DAM1-3 of the first dam and the third layer DAM2-3 of the second dam may be formed by the same process and made of the same material as the bank 118.

In the aspect of the present disclosure, the display device 100 is illustrated as including the dam structure DAM including the two dams DAM1 and DAM2 each having the three layers, but the present disclosure is not limited thereto. For example, the dam structure DAM may have two layers or four or more layers.

Referring to FIGS. 2, 3A, and 3B, the auxiliary metal layer 150 may be patterned, for example, it may include a plurality of holes H1 in a region of the dam structure DAM, i.e., a region between the first dam DAM1 and the second dam DAM2. That is, in a part of the region between the first dam DAM1 and the second dam DAM2, the first metal layer 151 and the second metal layer 152 are not disposed, and thus a partial region of the interlayer insulating layer may be exposed. Therefore, the first metal layer 151 and the second metal layer 152 are disposed in a lower region of the first dam DAM1 and a lower region of the second dam DAM2. However, the first metal layer 151 and the second metal layer 152 are disconnected between the lower region of the first dam DAM1 and the lower region of the second dam DAM2, such that the first inorganic sealing layer 191 may adjoin an upper surface of the interlayer insulating layer 113 through the plurality of holes H1.

Referring to FIG. 2, the plurality of holes H1 may each has a width equal to an interval between the first dam DAM1 and the second dam DAM2. Since the plurality of holes H1 each has the width equal to the interval between the first dam DAM1 and the second dam DAM2, two opposite ends of each of the plurality of holes H1 may adjoin the dam structure DAM in a plan view. However, the first metal layer 151 and the second metal layer 152 are disposed on the lower portion of the dam structure DAM even though the two opposite ends of the plurality of holes H1 adjoin the dam structure DAM. The plurality of holes H1 may have a rectangular shape in a plan view, and thus the auxiliary metal layer 150 may have a shape having a stripe pattern. However, the present disclosure is not limited thereto.

Therefore, in the display device 100 according to the aspect of the present disclosure, the plurality of holes H1 is disposed between the first dam DAM1 and the second dam DAM2, such that there is an additional space capable of accommodating the organic sealing layer 192 of the sealing part and the application state of the organic sealing layer 192 of the sealing part 190 may be inspected. The dam structure DAM may be disposed in the non-display area N/A and inhibit the overflow of the organic layer of the sealing part 190. That is, the first dam DAM1 may be disposed to surround the outer periphery of the display area A/A and primarily block the overflow of the organic sealing layer 192 of the sealing part 190. The second dam DAM2 may be disposed to surround the outer periphery of the first dam DAM1 and inhibit the organic sealing layer 192 from entering the pad area P/A. Therefore, the organic material of the organic sealing layer 192 may be disposed over the display area A/A and provided in the partial region between the first dam DAM1 and the second dam DAM2. That is, even though the first dam DAM1 primarily blocks the overflow of the organic material, the organic material flowing over the first dam DAM1 may be applied onto the region between the first dam DAM1 and the second dam DAM2. In this case, in the display device 100 according to the aspect of the present disclosure, the plurality of holes H1 is disposed in the auxiliary metal layer 150 between the first dam DAM1 and the second dam DAM2. Therefore, there occurs a partial region in which the first and second metal layers 151 and 152, which are made of opaque metal, are not disposed. Therefore, in comparison with the case in which the auxiliary metal layer 150 has no separate hole, it is possible to ensure the space capable of accommodating the organic sealing layer 192 of the sealing part 190 and check whether the organic sealing layer 192 of the sealing part 190 has been applied to some extent, through the plurality of open holes of the auxiliary metal layer 150. Therefore, in the case of the display device according to the aspect of the present disclosure, it is possible to easily ascertain a region on which the organic sealing layer 192 is disposed between the first dam DAM1 and the second dam DAM2, for example, by measuring a difference in reflectance between the region in which the organic sealing layer 192 is disposed and the region in which the organic sealing layer 192 is not disposed. The measurement of the difference in reflectance may be performed by emitting light from a rear surface of the substrate 110 to the plurality of holes H1 of the auxiliary metal layer 150.

Figure 4:
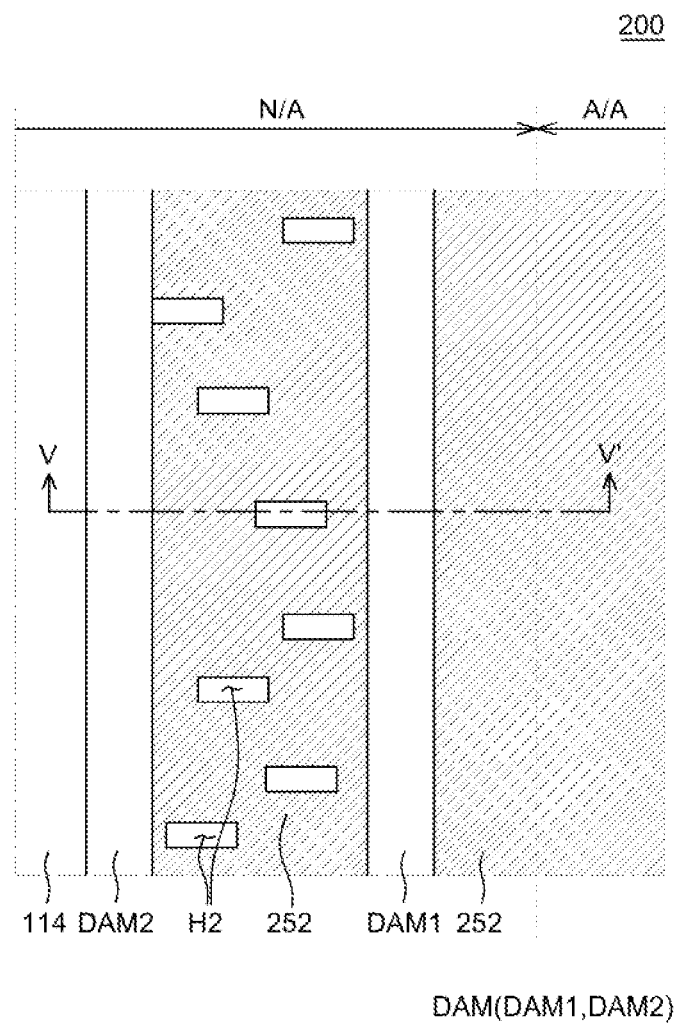
FIG. 4 is an enlarged top plan view of a region similar to the region A in FIG. 1 schematically illustrating a display device according to another aspect of the present disclosure.
Figure 5:
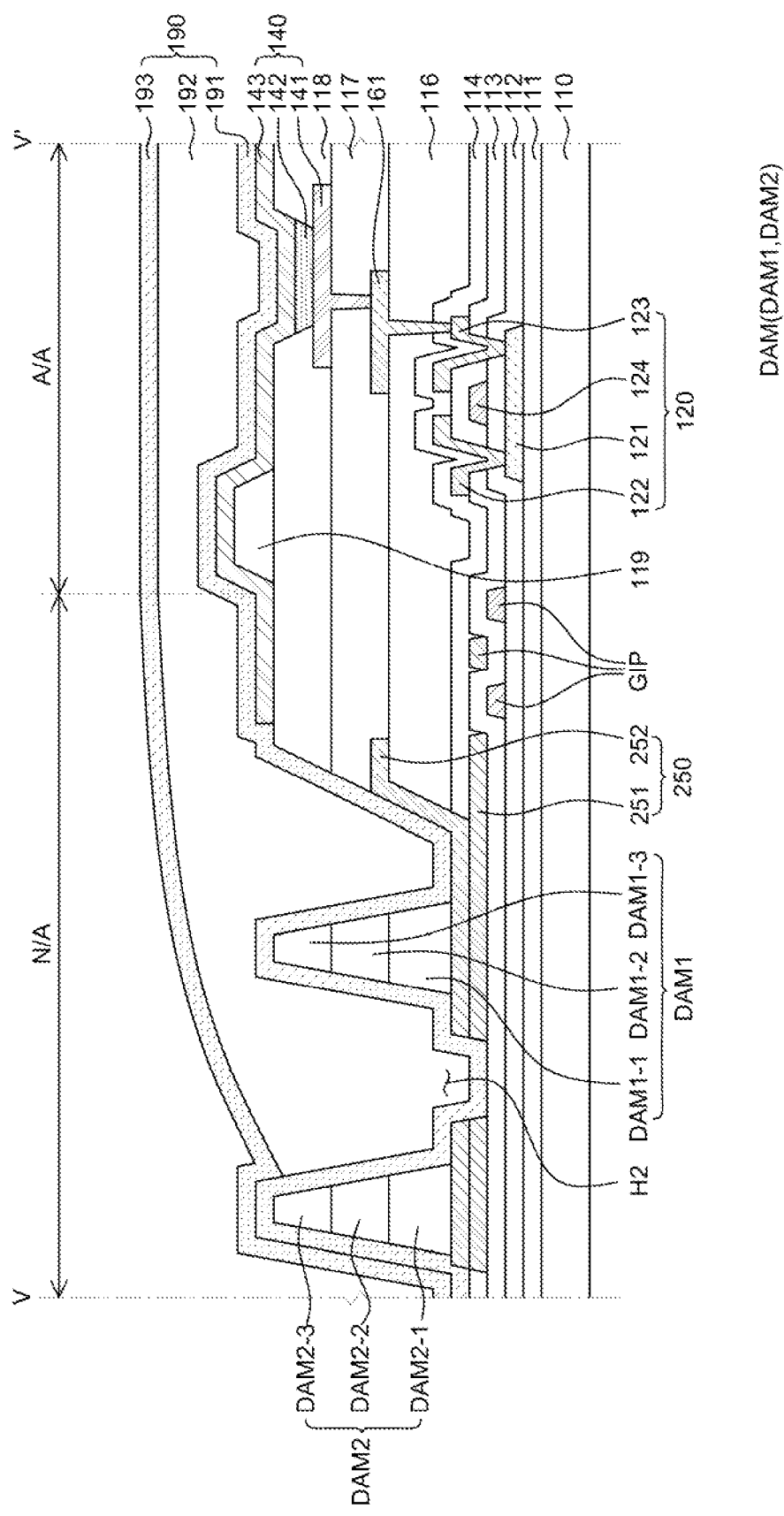
FIG. 5 is a cross-sectional view taken along line V-V in FIG. 4 and schematically illustrating the display device.

FIG. 4 is an enlarged top plan view of a region similar as the region A in FIG. 1 schematically illustrating a display device according to another aspect of the present disclosure. FIG. 5 is a cross-sectional view taken along line V-V in FIG. 4 and schematically illustrating the display device. A display device 200 illustrated in FIGS. 4 and 5 is substantially identical in configuration to the display device 100 illustrated in FIGS. 1 to 3B except for an auxiliary metal layer 250. Therefore, repeated descriptions of the identical components will be omitted.

Referring to FIGS. 4 and 5, the auxiliary metal layer 250 may include a plurality of holes H2 in a region of the dam structure DAM, i.e., a region between the first dam DAM1 and the second dam DAM2. The plurality of holes H2 each has a width smaller than an interval between the first dam DAM1 and the second dam DAM2. That is, two opposite ends of each of the plurality of holes H2 of the auxiliary metal layer 250 may be spaced apart from the first dam DAM1 and the second dam DAM2 and disposed between the first dam DAM1 and the second dam DAM2.

In addition, since the plurality of holes H2 of the auxiliary metal layer 250 each has the width smaller than the interval between the first dam DAM1 and the second dam DAM2, the plurality of holes H2 may be disposed at various positions between the first dam DAM1 and the second dam DAM2. That is, as illustrated in FIG. 4, the plurality of holes H2 may be randomly disposed between the first dam DAM1 and the second dam DAM2. However, the present disclosure is not limited thereto. The plurality of holes H2 may be regularly disposed between the first dam DAM1 and the second dam DAM2.

In addition, the plurality of holes H2 of the auxiliary metal layer 250 may each have a quadrangular shape, as illustrated in FIG. 4, but the present disclosure is not limited thereto. That is, the plurality of holes H2 may each have various shapes such as a polygonal shape, a circular shape, and an elliptical shape.

Therefore, in the display device 200 according to another aspect of the present disclosure, the plurality of holes H2 is disposed between the first dam DAM1 and the second dam DAM2, such that there is an additional space capable of accommodating the organic sealing layer 192 of the sealing part and the application state of the organic sealing layer 192 of the sealing part 190 may be inspected. As described above, the organic material of the organic sealing layer 192 may be disposed over the display area A/A and provided in the partial region between the first dam DAM1 and the second dam DAM2. Even though the first dam DAM1 primarily blocks the overflow of the organic material, the organic material flowing over the first dam DAM1 may be applied onto the region between the first dam DAM1 and the second dam DAM2. Therefore, in the case of the display device according to another aspect of the present disclosure, it is possible to easily ascertain the region on which the organic sealing layer 192 is disposed between the first dam DAM1 and the second dam DAM2, for example, by measuring a difference in reflectance between the region in which the organic sealing layer 192 is disposed and the region in which the organic sealing layer 192 is not disposed. The measurement of the difference in reflectance may be performed by emitting light from the rear surface of the substrate 110 to the plurality of holes H2 of the auxiliary metal layer 250.

In addition, the display device 200 according to another aspect of the present disclosure may be robust against cracks because the plurality of holes H2 of the auxiliary metal layer 250 each has the width smaller than the interval between the first dam DAM1 and the second dam DAM2 and the plurality of holes H2 is randomly disposed. In the case of a flexible display device in the related art, stress is applied to the flexible display device as the flexible display device is bent or folded, and the stress is concentrated on the bent region. In addition, even in the case of a general display device as well as the flexible display device, stress may be concentrated on a bezel region, which is a weak region, due to repeated processes of bending or unfolding the flexible display device that may be performed during the manufacturing process. That is, the region between the first dam DAM1 and the second dam DAM2 may be a region vulnerable to stress. Therefore, the plurality of holes H2 each has the width smaller than the interval between the first dam DAM1 and the second dam DAM2, and the plurality of holes H2 is randomly disposed between the dams, which makes it possible to mitigate and disperse stress. Therefore, it is possible to inhibit a crack from occurring in the first dam DAM1 and the second dam DAM2. Further, it is possible to reduce the occurrence of defects of the display device 200 that may be caused by the propagation of a crack toward the interior of the display area A/A. In addition, it is possible to inhibit outside moisture or oxygen from being introduced through a crack, which makes it possible to improve reliability and stability of the display device 200.

FIGS. 6A to 6D are enlarged top plan views of regions similar to the region A in FIG. 1 schematically illustrating display devices according to various aspects. Display devices 300a, 300b, 300c, and 300d illustrated in FIGS. 6A to 6D are substantially identical in configuration to the display device 200 illustrated in FIGS. 4 and 5 except for shapes of dam structures DAMa, DAMb, DAMc, and DAMd. Therefore, repeated descriptions of the identical components will be omitted. For the convenience of description, FIGS. 6A to 6D illustrate only the dam structure, the passivation layer, and the second metal layer of the auxiliary metal layer among various constituent elements of the display devices 300a, 300b, 300c, and 300d.

The first dam DAM1 surrounds the outer periphery of the display area A/A in order to primarily block the overflow of the organic sealing layer 192 of the sealing part 190. The second dam DAM2 surrounds the outer periphery of the first dam DAM1 in order to inhibit an overflow of the organic sealing layer 192 to the pad area P/A. In this case, the first dam DAM1 and the second dam DAM2 may each be configured as a multilayer. At least one of the first dam DAM1 and the second dam DAM2 may have concave-convex patterns disposed on one or more side surfaces of two opposite surfaces thereof.

In this case, the concave-convex pattern may include at least one protruding portion and at least one concave portion having a particular shape and disposed on the side surface of each of the first and second dam DAM1 and DAM2. That is, the sidewall of each of the first and second dams DAM1 and DAM2 may have a serrated surface in which protruding surfaces and recessed surfaces are continuously formed. In this case, at least one protruding portion and at least one concave portion may have various shapes such as a polygonal shape, a circular shape, and an elliptical shape. FIGS. 6A to 6D illustrate that a quadrangular shape protrudes, but the present disclosure is not limited thereto.

Figure 6A:
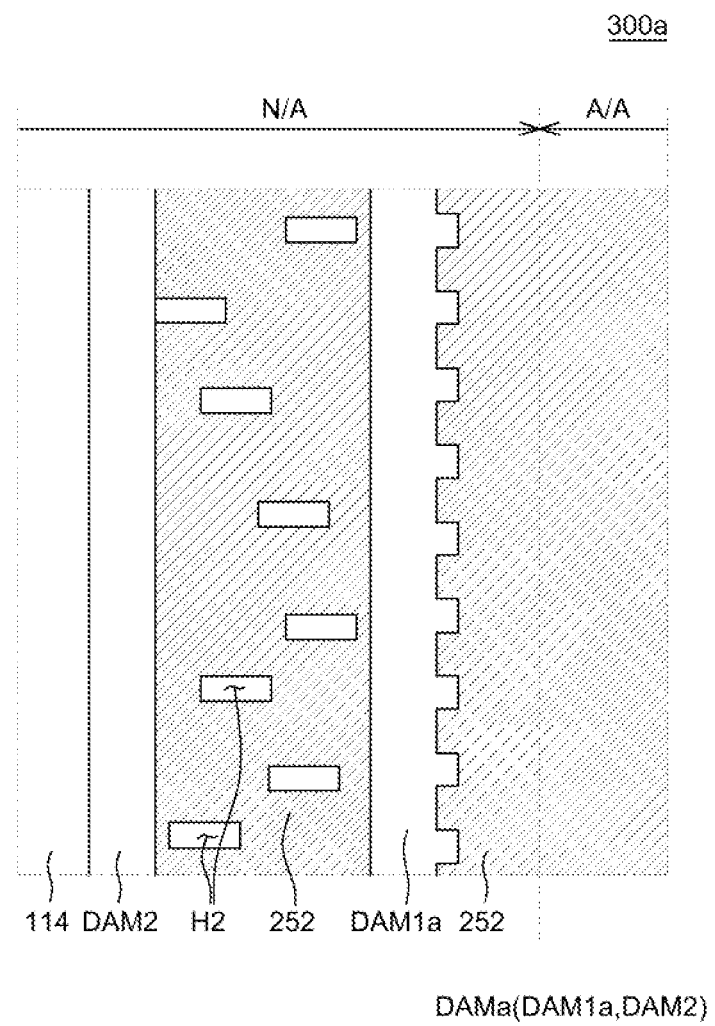
FIGS. 6A to 6D are enlarged top plan views of regions similar to the region A in FIG. 1 schematically illustrating display devices according to various aspects.

First, referring to FIG. 6A, in the display device 300*a* according to another aspect of the present disclosure, the dam structure DAMa may be disposed and include a concave-convex pattern formed on a side surface of a first dam DAM1*a* adjacent to the display area A/A. That is, the first dam DAM1*a* may include a first inner concave-convex pattern disposed on an inner surface thereof. However, an outer surface of the first dam DAM1*a* and a side surface of the second dam DAM2 may each be disposed in a flat shape without a concave-convex pattern.

Figure 6B:
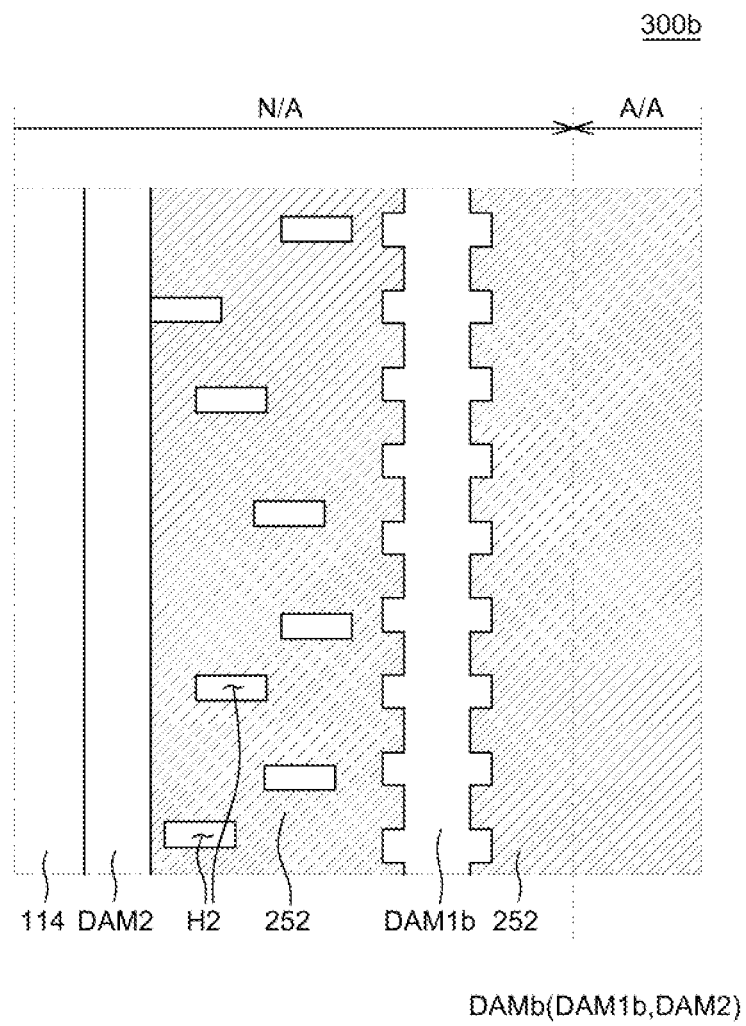

Next, referring to FIG. 6B, in the display device 300*b* according to another aspect of the present disclosure, the dam structure DAMb may be disposed and include concave-convex patterns formed on both a side surface of a first dam DAM1*b* adjacent to the display area A/A and the opposite side surface to the side surface of the first dam DAM1*b* adjacent to the display area A/A. That is, the first dam DAM1*b* may include a first inner concave-convex pattern disposed on an inner surface thereof, and a first outer concave-convex pattern disposed on an outer surface thereof. In this case, the first inner concave-convex pattern and the first outer concave-convex pattern may be disposed to correspond to each other. A protruding portion of the first inner concave-convex pattern and a protruding portion of the first outer concave-convex pattern may face each other. A concave portion of the first inner concave-convex pattern and a concave portion of the first outer concave-convex pattern may face each other.

Figure 6C:
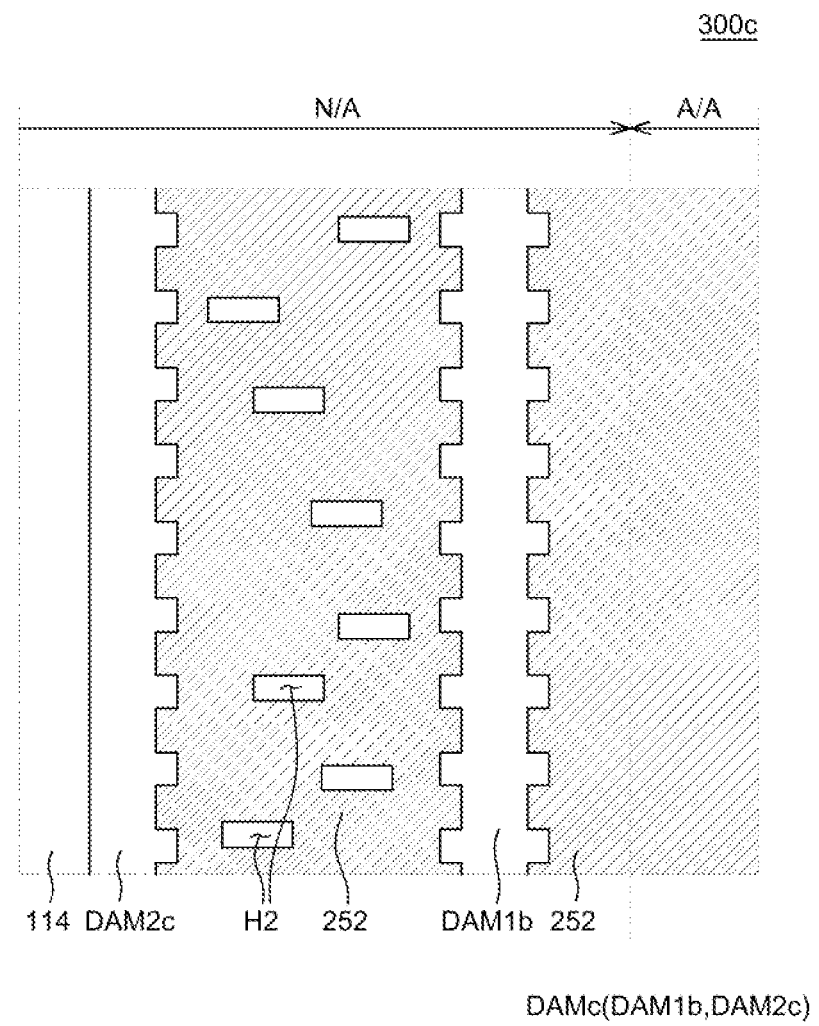

Next, referring to FIG. 6C, in the display device 300*c* according to another aspect of the present disclosure, the dam structure DAMc may be disposed and include concave-convex patterns formed on two opposite surfaces of the first dam DAM1*b* and a side surface of a second dam DAM2*c* adjacent to the first dam DAM1*b*. That is, the first dam DAM1*b* may include a first inner concave-convex pattern disposed on an inner surface thereof, and a first outer concave-convex pattern disposed on an outer surface thereof. The second dam DAM2*c* may include a second inner concave-convex pattern disposed on an inner surface thereof. In this case, the first inner concave-convex pattern and the first outer concave-convex pattern may be disposed to correspond to each other. The second inner concave-convex pattern and the first outer concave-convex pattern may be disposed to correspond to each other. A protruding portion of the second inner concave-convex pattern and a protruding portion of the first outer concave-convex pattern may face each other. A concave portion of the second inner concave-convex pattern and a concave portion of the first outer concave-convex pattern may face each other.

Figure 6D:
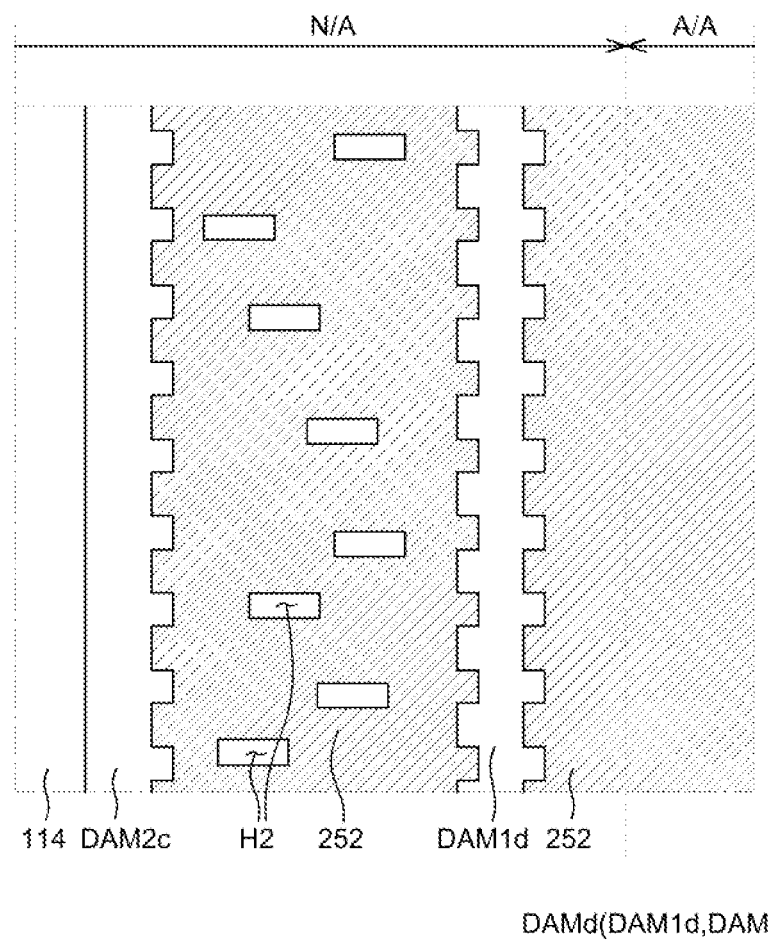

Next, referring to FIG. 6D, in the display device 300*d* according to another aspect of the present disclosure, the dam structure DAMd may be disposed and include concave-convex patterns formed on two opposite surfaces of a first dam DAM1*d* and a side surface of the second dam DAM2*c* adjacent to the first dam DAM1*d*. That is, the first dam DAM1*d* may include a first inner concave-convex pattern disposed on an inner surface thereof, and a first outer concave-convex pattern disposed on an outer surface thereof. The second dam DAM2*c* may include a second inner concave-convex pattern disposed on an inner surface thereof. In this case, the first inner concave-convex pattern and the first outer concave-convex pattern may be disposed in a zigzag manner. The second inner concave-convex pattern and the first outer concave-convex pattern may be disposed in a zigzag manner. A protruding portion of the first inner concave-convex pattern and a concave portion of the first outer concave-convex pattern may face each other. A concave portion of the first inner concave-convex pattern and a protruding portion of the first outer concave-convex pattern may face each other. A protruding portion of the second inner concave-convex pattern and a concave portion of the first outer concave-convex pattern may face each other. A concave portion of the second inner concave-convex pattern and a protruding portion of the first outer concave-convex pattern may face each other.

Therefore, in the display devices 300*a*, 300*b*, 300*c*, and 300*d* according to the various aspects of the present disclosure, the concave-convex patterns are provided on one or more side surfaces among the two opposite surfaces of each of the dam structures DAMa, DAMb, DAMc, and DAMd. Therefore, it is possible to increase contact areas between the organic sealing layer 192 of the sealing part 190 and the sidewalls of the dam structures DAMa, DAMb, DAMc, and DAMd. The organic sealing layer 192 may be disposed to conform to the concave-convex pattern formed on the side surface of each of the dam structures DAMa, DAMb, DAMc, and DAMd. That is, the organic sealing layer 192 may be disposed to fill the concave portions of the concave-convex pattern formed on the side surface of each of the dam structures DAMa, DAMb, DAMc, and DAMd. The structure in which the organic sealing layer 192 fills the portions between the concave-convex patterns of each of the dam structures DAMa, DAMb, DAMc, and DAMd may increase the contact area between the organic sealing layer 192 and each of the dam structures DAMa, DAMb, DAMc, and DAMd. Therefore, it is possible to increase surface tension of the organic sealing layer 192 made of an organic material. The dam structures DAMa, DAMb, DAMc, and DAMd serve to inhibit the overflow of the organic sealing layers 192. Therefore, the increase in surface tension of the organic sealing layer 192 with respect to each of the dam structures DAMa, DAMb, DAMc, and DAMd may reduce the overflow of the organic sealing layer 192, thereby inhibiting the occurrence of defects.

The contact area between the organic sealing layer 192 and the dam structure DAMb including the first inner concave-convex pattern and the first outer concave-convex pattern respectively formed on the inner surface and the outer surface of the first dam DAM1*b* is larger than the contact area between the organic sealing layer 192 and the dam structure DAMa including only the first inner concave-convex pattern formed on the inner surface of the first dam DAM1*a*. In addition, the contact area between the organic sealing layer 192 and the dam structure DAMc or DAMd further including the second inner concave-convex pattern formed on the inner surface of the second dam DAM2*c* is larger than the contact area between the organic sealing layer 192 and the dam structure DAMb including the first inner concave-convex pattern and the first outer concave-convex pattern respectively formed on the inner surface and the outer surface of the first dam DAM1*b*. The surface tension of the organic sealing layer 192 with respect to each of the dam structures DAMa, DAMb, DAMc, and DAMd increases as the contact area increases. The dam structure, which has a larger number of concave-convex patterns among the dam structures DAMa, DAMb, DAMc, and DAMd, may effectively inhibit the overflow of the organic sealing layer 192. That is, the display device 300*b* including the dam structure DAMb may be more advantageous in inhibiting the overflow of the organic sealing layer 192 than the display device 300*a* including the dam structure DAMa. The display device 300*c* or 300*d* including the dam structure DAMc or DAMd may be more advantageous in inhibiting the occurrence of defects than the display device 300*b* including the dam structure DAMb.

In particular, in the display device 300*d* according to another aspect of the present disclosure, the first inner concave-convex pattern and the first outer concave-convex pattern of the first dam DAM1*d* are disposed in a zigzag manner, such that the display device is robust against stress concentrated on the bezel region As described above, even in the case of the flexible display device as well as the display device in the related art, stress may be concentrated on the bezel region due to repeated processes of bending or unfolding the flexible display device that may be performed during the manufacturing process. Therefore, the region in which the dam structure DAMa, DAMb, DAMc, or DAMd existing in the bezel region is disposed may be vulnerable to a crack caused by the concentration of stress. However, in the case of the display device 300*d* according to another aspect of the present disclosure, the width of the first dam DAM1*d* may not decrease in a particular region because the first inner concave-convex pattern and the first outer concave-convex pattern are disposed in a zigzag manner even though the protruding portions and the concave portions are repeatedly formed when the concave-convex pattern is formed on the first dam DAM1*d*. That is, the width of the first dam DAM1*d* is constant at all points, which makes it possible to disperse stress while inhibiting the stress from being concentrated on the particular region, thereby making the display device robust against a crack.

Figure 7:
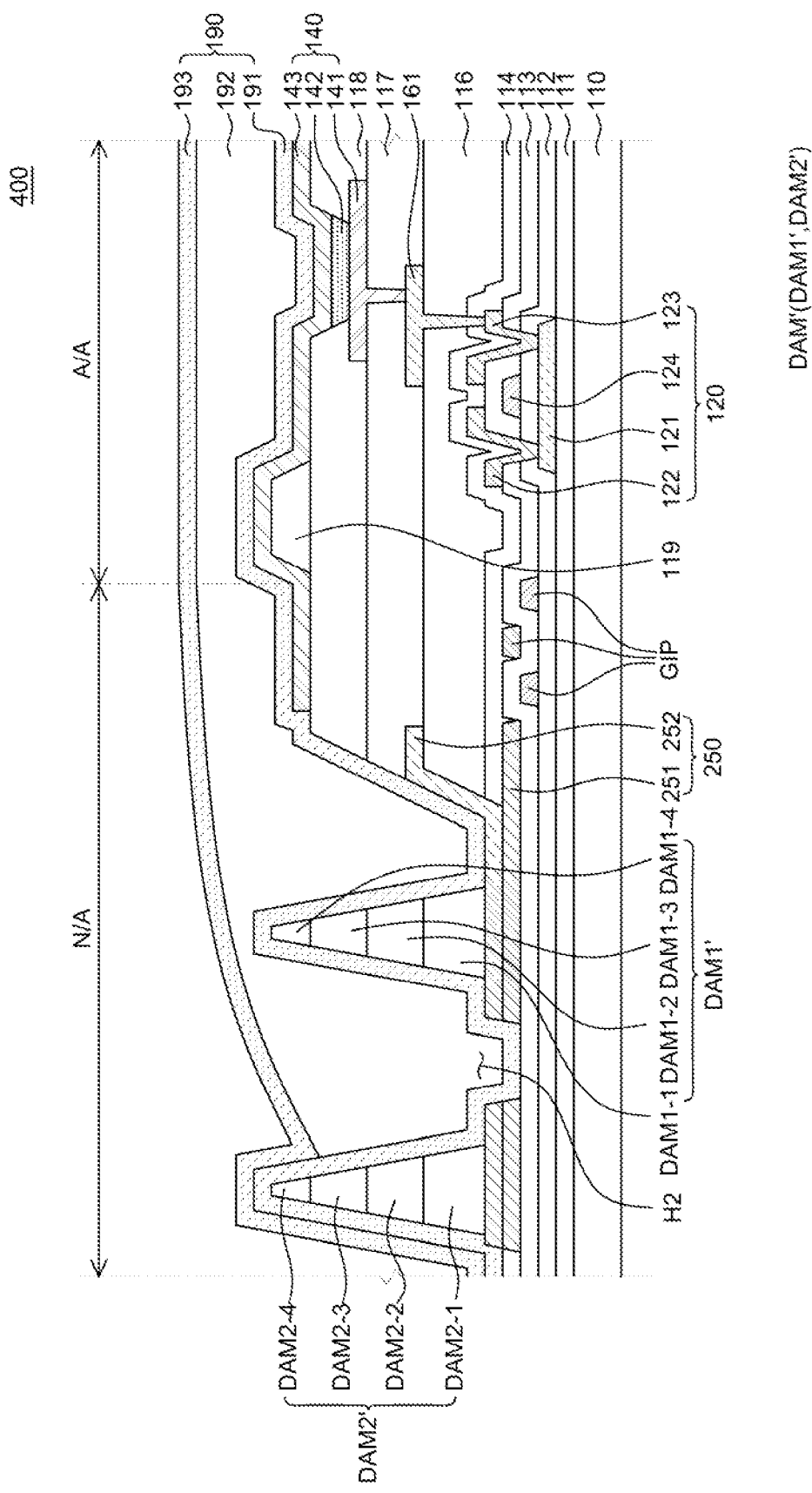
FIG. 7 is a partial cross-sectional view schematically illustrating a display device according to still another aspect of the present disclosure.

FIG. 7 is a partial cross-sectional view schematically illustrating a display device according to still another aspect of the present disclosure. A display device 400 illustrated in FIG. 7 is substantially identical in configuration to the display device 200 illustrated in FIGS. 4 and 5 except for a dam structure DAM'. Therefore, repeated descriptions of the identical components will be omitted.

Referring to FIG. 7, the dam structure DAM' may be disposed on the passivation layer 114 in the non-display area N/A. The dam structure DAM' inhibits the overflow of the organic sealing layer 192 of the sealing part 190. The dam structure DAM' may include a second dam DAM2', and a first dam DAM1' disposed between the second dam DAM2' and the display area A/A.

The first dam DAM1' and the second dam DAM2' may each be configured as a multilayer. For example, the first dam DAM1' may include a first layer DAM1-1 of the first dam, a second layer DAM1-2 of the first dam, a third layer DAM1-3 of the first dam, and a fourth layer DAM1-4 of the first dam. Further, the second dam DAM2' may include a first layer DAM2-1 of the second dam, a second layer DAM2-2 of the second dam, a third layer DAM2-3 of the second dam, and a fourth layer DAM2-4 of the second dam. The first layer DAM1-1 of the first dam and the first layer DAM2-1 of the second dam may be disposed on the passivation layer 114 and a second metal layer 252. The first layer DAM1-1 of the first dam and the first layer DAM2-1 of the second dam may be formed by the same process and made of the same material as the first planarization layer 116.

The second layer DAM1-2 of the first dam may be disposed on the first layer DAM1-1 of the first dam. In addition, the second layer DAM2-2 of the second dam may be disposed on the first layer DAM2-1 of the second dam. The second layer DAM1-2 of the first dam and the second layer DAM2 of the second dam may be formed by the same process and made of the same material as the second planarization layer 117.

The third layer DAM1-3 of the first dam may be disposed on the second layer DAM1-2 of the first dam. Further, the third layer DAM2-3 of the second dam may be disposed on the second layer DAM2-2 of the second dam. In addition, the third layer DAM1-3 of the first dam and the third layer DAM2-3 of the second dam may be formed by the same process and made of the same material as the bank 118.

The fourth layer DAM1-4 of the first dam may be disposed on the third layer DAM1-3 of the first dam. Further, the fourth layer DAM2-4 of the second dam may be disposed on the third layer DAM2-3 of the second dam. In addition, the fourth layer DAM1-4 of the first dam and the fourth layer DAM2-4 of the second dam may be formed by the same process and made of the same material as the spacer 119. Therefore, the fourth layer DAM1-4 of the first dam and the fourth layer DAM2-4 of the second dam may each be referred to as an additional spacer. The fourth layer DAM1-4 of the first dam and the fourth layer DAM2-4 of the second dam may each have a cross-section having an area that decreases upward in a plan view. The fourth layer DAM1-4 of the first dam and the fourth layer DAM2-4 of the second dam may each have a triangular cross-section, but the present disclosure is not limited thereto.

In the aspect of the present disclosure, the display device 400 is illustrated as including the dam structure DAM' having two dams each having four layers, but the present disclosure is not limited thereto. For example, the two dams of the dam structure DAM' each may have four or more layers.

The display device 400 according to another aspect of the present disclosure includes the two dams each having the four layers, which makes it possible to more effectively inhibit the organic sealing layer 192 of the sealing part 190 from flowing over the outer periphery of the dam structure DAM'. The first dam DAM1' further includes the fourth layer DAM1-4 of the first dam, and the second dam DAM2' further includes the fourth layer DAM2-4 of the second dam, such that a height of the first dam DAM1' and a height of the second dam DAM2' may be increased, which makes it possible to ensure a space that may accommodate the organic sealing layer 192 of the sealing part 190. Therefore, it is possible to reduce a degree to which the organic sealing layer 192 primarily flows over the outer periphery of the first dam DAM1'. Further, it is possible to more effectively inhibit the organic sealing layer 192 from secondarily flowing over the outer periphery of the second dam DAM2' even though the organic sealing layer 192 flows over the outer periphery of the first dam DAM1'. Therefore, it is possible to inhibit the occurrence of film defects of the sealing part 190 by minimizing the overflow of the organic sealing layer 192 over the dam structure DAM'. Further, it is possible to improve stability and reliability by protecting the display device 400 from outside moisture and foreign materials.

Figure 8:
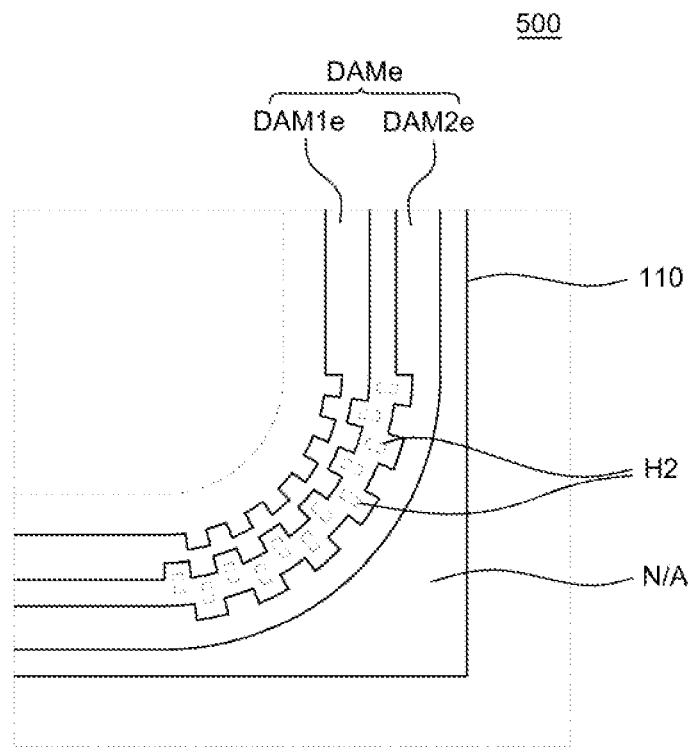
FIG. 8 is an enlarged partial top plan view schematically illustrating a display device according to yet another aspect of the present disclosure.

FIG. 8 is an enlarged partial top plan view schematically illustrating a display device according to yet another aspect of the present disclosure. A display device 500 illustrated in FIG. 8 is substantially identical in configuration to the display device 200 illustrated in FIGS. 4 and 5 except for the dam structure DAM and the plurality of holes H2. Therefore, repeated descriptions of the identical components will be omitted. For the convenience of description, FIG. 8 illustrates only the substrate, the first dam, the second dam, and the plurality of holes among various constituent elements of the display device 500.

Referring to FIG. 8, the auxiliary metal layer 250 may include a plurality of holes H2 in a region of the dam structure DAMe, i.e., a region between a first dam DAM1*e* and a second dam DAM2e. The plurality of holes H2 illustrated in FIG. 8 each has a width smaller than an interval between the first dam DAM1e and the second dam DAM2e. That is, two opposite ends of each of the plurality of holes H2 of the auxiliary metal layer 250 may be respectively spaced apart from the first dam DAM1e and the second dam DAM2e.

In addition, since the plurality of holes H2 of the auxiliary metal layer 250 each has the width smaller than the interval between the first dam DAM1e and the second dam DAM2e, the plurality of holes H2 may be randomly disposed at various positions between the first dam DAM1e and the second dam DAM2e.

However, the plurality of holes H2 of the auxiliary metal layer 250 may be disposed only in the region between the first dam DAM1e and the second dam DAM2e that corresponds to a corner of the display area A/A. Only a corner of each of the first and second dams DAM1e and DAM2e may be designed to be rounded. In this case, the plurality of holes H2 of the auxiliary metal layer 250 may be randomly disposed only in the rounded corner region. That is, the plurality of holes H2 may be present only in four corner regions of the substrate 110.

Further, concave-convex patterns may be disposed on one or more side surfaces of two opposite surfaces of at least one of the first and second dams DAM1e and DAM2e. In this case, the concave-convex pattern may include at least one protruding portion or at least one concave portion having a particular shape on the side surface of each of the first and second dams DAM1e and DAM2e. That is, the sidewall of each of the first and second dams DAM1e and DAM2e may have a serrated surface in which protruding surfaces and recessed surfaces are continuously formed. In this case, at least one protruding portion or at least one concave portion may have various shapes such as a polygonal shape, a circular shape, and an elliptical shape.

In addition, the first inner concave-convex pattern of the first dam DAM1e and the first outer concave-convex pattern of the first dam DAM1e may be disposed in a zigzag manner. The first outer concave-convex pattern of the first dam DAM1e and the second inner concave-convex pattern of the second dam DAM2e may also be disposed in a zigzag manner. A protruding portion of the first inner concave-convex pattern and a concave portion of the first outer concave-convex pattern may face each other. A concave portion of the first inner concave-convex pattern and a protruding portion of the first outer concave-convex pattern may face each other. A protruding portion of the second inner concave-convex pattern and a concave portion of the first outer concave-convex pattern may face each other. A concave portion of the second inner concave-convex pattern and a protruding portion of the first outer concave-convex pattern may face each other.

However, the first inner concave-convex pattern of the first dam DAM1e, the first outer concave-convex pattern of the first dam DAM1e, and the second inner concave-convex pattern of the second dam DAM2e may be disposed only in the region corresponding to the corner of the display area A/A. That is, only the corner of each of the first and second dams DAM1e and DAM2e may be designed to be rounded. In this case, the first inner concave-convex pattern, the first outer concave-convex pattern, and the second inner concave-convex pattern may be formed only in the rounded corner region of the dam structure DAMe. That is, the concave-convex patterns may be present only in the four corner regions of the substrate 110.

Therefore, in the display device 500 according to another aspect of the present disclosure, the plurality of holes H2 and the concave-convex patterns are disposed only in the region corresponding to the corner of the display area A/A. Therefore, it is possible to more efficiently inhibit the organic sealing layer 192 of the sealing part 190 from flowing over the outer periphery of the dam structure DAMe. In particular, in the case in which the first and second dams DAM1e and DAM2e each have the rounded corner, the corner region may be relatively more vulnerable to the overflow of the organic sealing layer 192 of the sealing part 190 than the other regions. Therefore, it is possible to efficiently check whether the organic sealing layer 192 has been normally applied onto the corner region even though the plurality of holes H2 is disposed only in the corner region in which it is difficult to block the overflow of the organic sealing layer 192. Therefore, it is possible to effectively inhibit the organic sealing layer 192 from flowing over the outer periphery of the dam structure DAMe. Therefore, it is possible to inhibit the occurrence of film defects of the sealing part 190 by minimizing the overflow of the organic sealing layer 192 over the dam structure DAMe. Further, it is possible to effectively improve stability and reliability by protecting the display device 500 from outside moisture and foreign materials.

The exemplary aspects of the present disclosure can also be described as follows:

According to an aspect of the present disclosure, there is provided a display device. The display device includes a substrate including a display area and a non-display area configured to surround the display area, an inorganic insulating layer on the substrate, a metal layer on the inorganic insulating layer, a dam structure on the metal layer in the non-display area and including a first dam and a second dam positioned to be closer to an outer side of the substrate than be the first dam and a sealing part configured to cover a part of the display area and a part of the non-display area and cover a surface of the dam structure, wherein the metal layer is patterned between the first dam and the second dam.

The metal layer may comprise a plurality of holes disposed between the first dam and the second dam.

Each of the plurality of holes may have a width equal to an interval between the first dam and the second dam.

Each of the plurality of holes may be randomly disposed between the first dam and the second dam.

Each of the plurality of holes may have a width smaller than an interval between the first dam and the second dam.

Two opposite ends of each of the plurality of holes may be respectively spaced apart from the first dam and the second dam.

Each of the plurality of holes may have one of a polygonal shape, a circular shape, and an elliptical shape.

At least one of the first and second dams may include concave-convex patterns disposed on one or more side surface of two opposite surfaces thereof.

The first dam comprises a first inner concave-convex pattern may be disposed on an inner surface thereof adjacent to the display area.

The first dam comprises a first inner concave-convex pattern and a first outer concave-convex pattern respectively may be disposed on an inner surface adjacent to the display area and an outer surface thereof opposite to the inner surface, and the first inner concave-convex pattern and the first outer concave-convex pattern may be disposed to correspond to each other.

The second dam comprises a second inner concave-convex pattern may be disposed on an inner surface thereof adjacent to the first dam, and the second inner concave-convex pattern may be disposed to correspond to the first outer concave-convex pattern.

The first dam comprises a first inner concave-convex pattern and a first outer concave-convex pattern respectively may be disposed on an inner surface adjacent to the display area and an outer surface thereof opposite to the inner, and the first inner concave-convex pattern and the first outer concave-convex pattern may be disposed in a zigzag manner.

The second dam comprises a second inner concave-convex pattern may be disposed on an inner surface thereof adjacent to the first dam, and the second inner concave-convex pattern and the first outer concave-convex pattern may be disposed in a zigzag manner.

The display device may include a spacer disposed in the display area and an additional spacer may be disposed on the first dam and the second dam and made of the same material as the spacer, wherein a cross-sectional shape of the additional spacer may have an area that decreases upward in a plan view.

The plurality of holes and the concave-convex pattern may be disposed only in a region corresponding to a corner of the display area.

A corner of the each of the first dam and the second dam may be rounded.

The sealing part may be adjoined the inorganic insulating layer through the plurality of holes.

The concave-convex pattern may include at least one protruding portion and at least one concave portion having a polygonal shape, a circular shape, or an elliptical shape.

The sealing part may be disposed to fill a concave portion of the concave-convex pattern.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device comprising:
   a substrate including a display area and a non-display area surrounding the display area;
   an inorganic insulating layer disposed on the substrate;
   a metal layer disposed on the inorganic insulating layer;
   a dam structure disposed on the metal layer in the non-display area and including a first dam and a second dam positioned to be closer to an outer side of the substrate than the first dam; and
   a sealing part covering a part of the display area and a part of the non-display area and covering a surface of the dam structure,
   wherein the metal layer is patterned between the first dam and the second dam and includes a plurality of holes disposed between the first dam and the second dam, and
   wherein the sealing part is in contact with the inorganic insulating layer through the plurality of holes.

2. The display device of claim 1, wherein each of the plurality of holes has a width equal to an interval between the first dam and the second dam.

3. The display device of claim 1, wherein each of the plurality of holes is randomly disposed between the first dam and the second dam.

4. The display device of claim 1, wherein each of the plurality of holes has a width smaller than an interval between the first dam and the second dam.

5. The display device of claim 4, wherein two opposite ends of each of the plurality of holes are respectively spaced apart from the first dam and the second dam.

6. The display device of claim 4, wherein each of the plurality of holes has one of a polygonal shape, a circular shape, and an elliptical shape.

7. The display device of claim 1, wherein at least one of the first and second dams includes concave-convex patterns disposed on one or more side surface of two opposite surfaces thereof.

8. The display device of claim 7, wherein the first dam comprises a first inner concave-convex pattern disposed on an inner surface thereof adjacent to the display area.

9. The display device of claim 7, wherein the first dam comprises a first inner concave-convex pattern and a first outer concave-convex pattern respectively disposed on an inner surface adjacent to the display area and an outer surface thereof opposite to the inner surface, and
   the first inner concave-convex pattern and the first outer concave-convex pattern are disposed to correspond to each other.

10. The display device of claim 9, wherein the second dam comprises a second inner concave-convex pattern disposed on an inner surface thereof adjacent to the first dam, and
    the second inner concave-convex pattern is disposed to correspond to the first outer concave-convex pattern.

11. The display device of claim 7, wherein the first dam comprises a first inner concave-convex pattern and a first outer concave-convex pattern respectively disposed on an inner surface adjacent to the display area and an outer surface thereof opposite to the inner surface, and
    the first inner concave-convex pattern and the first outer concave-convex pattern are disposed in a zigzag manner.

12. The display device of claim 11, wherein the second dam comprises a second inner concave-convex pattern disposed on an inner surface thereof adjacent to the first dam, and
    the second inner concave-convex pattern and the first outer concave-convex pattern are disposed in a zigzag manner.

13. The display device of claim 7, further comprising:
    a spacer disposed in the display area; and
    an additional spacer disposed on the first dam and the second dam and made of a same material as the spacer,
    wherein a cross-sectional shape of the additional spacer has an area that decreases upward in a plan view.

14. The display device of claim 7, wherein the plurality of holes and the concave-convex pattern are disposed only in a region corresponding to a corner of the display area.

15. The display device of claim 14, wherein a corner of each of the first dam and the second dam is rounded.

16. The display device of claim 7, wherein the concave-convex pattern includes at least one protruding portion and at least one concave portion having one of a polygonal shape, a circular shape, and an elliptical shape.

17. The display device of claim 7, wherein the sealing part is disposed to fill a concave portion of the concave-convex pattern.

\* \* \* \* \*